(12) United States Patent
Charbon et al.

(10) Patent No.: US 7,683,308 B2
(45) Date of Patent: Mar. 23, 2010

(54) CONTROLLING SPECTRAL RESPONSE OF PHOTODETECTOR FOR AN IMAGE SENSOR

(75) Inventors: Edoardo Charbon, Echandens (CH); Cristiano Niclass, Clarens (CH)

(73) Assignee: Ecole Polytechnique Federale de Lausanne EFPL, Lausanne (CH)

( * ) Notice: Subject to any disclaimer, the term of this patent is extended or adjusted under 35 U.S.C. 154(b) by 0 days.

(21) Appl. No.: 11/290,831

(22) Filed: Dec. 1, 2005

(65) Prior Publication Data

US 2006/0131480 A1 Jun. 22, 2006

(30) Foreign Application Priority Data

Dec. 1, 2004 (EP) .................................. 04106228

(51) Int. Cl.
*H01J 40/14* (2006.01)
(52) U.S. Cl. .................................. 250/214 R; 257/186
(58) Field of Classification Search ............... 250/208.1, 250/214 R, 214.1, 226; 327/514; 257/431, 257/443, 461, 464, 186
See application file for complete search history.

(56) References Cited

U.S. PATENT DOCUMENTS

| 4,303,861 | A | | 12/1981 | Ekstrom ................. 250/370.14 |
| 4,710,817 | A | | 12/1987 | Ando .......................... 348/310 |
| 5,789,263 | A | * | 8/1998 | Kuo et al. ...................... 438/57 |
| 5,892,575 | A | | 4/1999 | Marino |
| 6,218,657 | B1 | * | 4/2001 | Bethune et al. ......... 250/214 R |
| 6,300,612 | B1 | * | 10/2001 | Yu ........................... 250/208.1 |
| 6,376,321 | B1 | | 4/2002 | Popovic et al. |
| 6,392,282 | B1 | * | 5/2002 | Sahara et al. ............... 257/438 |
| 6,563,185 | B2 | * | 5/2003 | Moddel et al. ............. 257/425 |
| 6,693,311 | B2 | * | 2/2004 | Guenter et al. ............. 257/184 |
| 6,741,341 | B2 | | 5/2004 | DeFlumere .............. 356/141.1 |
| 6,797,581 | B2 | * | 9/2004 | Vickers ...................... 438/380 |
| 6,914,314 | B2 | * | 7/2005 | Merrill et al. ............... 257/440 |
| 6,927,889 | B2 | | 8/2005 | Schwarte |
| 7,012,738 | B1 | | 3/2006 | Schwarte |
| 7,262,402 | B2 | | 8/2007 | Niclass |
| 2001/0023944 | A1 | * | 9/2001 | Maruyama et al. ............ 257/53 |
| 2002/0024058 | A1 | * | 2/2002 | Marshall et al. ............. 257/170 |
| 2003/0164444 | A1 | * | 9/2003 | Yoneda et al. ........... 250/214.1 |

(Continued)

FOREIGN PATENT DOCUMENTS

EP 1191598 3/2002

OTHER PUBLICATIONS

Jackson, J.C., Characterization of Large Area SPAD Detectors Operated in Avalance Photodiode Mode, 13$^{th}$ Annual Meeting, IEEE, vol. 1, Nov. 13-16, pp. 17-18.

(Continued)

*Primary Examiner*—Thanh X Luu

(57) ABSTRACT

A method for controlling the spectral response of light sensitive semiconductor elements in an array (8) using an electric control signal ($V_{op}$) applied to said semiconductor elements. The light sensitive semiconductor elements could be a single photon avalanche diode (81) operating in Geiger mode. An image sensor has at least one light sensitive semiconductor elements and a circuit for applying a control voltage ($V_{op}$) to said semiconductor element so as to change its spectral response. Without being limiting, the sensor could be part of a digital camera, video camera, 3D image sensors, scanner, video telephone, autofocus system, medical image acquisition system, etc.

24 Claims, 7 Drawing Sheets

U.S. PATENT DOCUMENTS

| | | | |
|---|---|---|---|
| 2004/0130702 A1* | 7/2004 | Jupp et al. | 356/5.01 |
| 2004/0245592 A1 | 12/2004 | Harmon | 257/438 |
| 2005/0012033 A1* | 1/2005 | Stern et al. | 250/214 R |
| 2005/0077539 A1* | 4/2005 | Lipson | 257/186 |
| 2005/0087673 A1* | 4/2005 | Chen et al. | 250/214.1 |
| 2006/0124832 A1 | 6/2006 | Harmon et al. | 250/214 R |
| 2006/0175529 A1 | 8/2006 | Harmon et al. | 250/214 R |
| 2006/0266926 A1* | 11/2006 | Chuang et al. | 250/208.1 |
| 2008/0006816 A1* | 1/2008 | Krishna et al. | 257/14 |

OTHER PUBLICATIONS

Albota et al., Three-Dimensional Imaging Laser Radar with a Photon-Counting Avalance Photodiode Array and Microchip Laser, Applied Optics, Dec. 2002, vol. 41, No. 36.

Aull et al., Three-Dimensional Imaging with Arrays of Geiger-Mode Avalance Photodiodes, Semiconductor Photodetectors, Proceedings of SPIE, vol. 5353, 2004.

Zappa et al., Monolithic CMOS Detector Module for Photon Counting and Picosecond Timing, IEEE, Sep. 2004, pp. 341-344.

Edwin P. Walker et al., "Two-photon Volumetric Optical Disk Storage Systems Experimental Results and Potentials" Call/Recall, Inc., 3 pages, 2003.

Yi Zang et al., "Numerical Aperture Influence on 3-D Multi-layer Optical Data Storage Systems" Call/Recall, Inc. And Genoptix Inc, 3 pages, 2002.

Edwin P. Walker et al., 3-D Parallel Readout in a 3-D Multi-layer Optical Data Storage System, Call/Recall, Inc. Genoptix, Inc. and Emcore Fiber Optics Components, 3 pages, 2002.

Jyh-Shin Pan et al., "A CMOS Multi-Format Read/WriteSoC for 7× Blu-ray/16× DVD/56× CD" ISSCC 2005, Session 31, Mass Storage 31.3, pp. 572-573 and 618.

C. Niclass et al., "Design and Characterization of a CMOS 3-D Image Sensor Based on Single Photon Avalanche Diodes", IEEE Journal of Solid-State Circuits, pp. 1847-1854, Sep. 2005.

Rochas et al., First Passively-Quenched Single Photon Counting Avalanche Photodiode Element Integrated in a Conventional CMOS Process with 32ns Dead Time, 9 pages, 2002.

Niclass et al., A CMOS Single Photon Avalanche Diode Array for 3D Imaging, ISSCC 2004, Session 6, Imaging, 6.7, 2004, 10 pages.

Rochas et al., First Fully Integrated 2-D Array of Single-Photon Detectors in Standard CMOS Technology, IEEE Photonics Technology Letters, Jul. 2003, pp. 963-965, vol. 15, No. 7.

Rochas et al., Single Photon Detector Fabricated in a Complementary Metal-Oxide-Semiconductor High-Voltage Technology, Review of Scientific Instruments, Jul. 2003, pp. 3263-3270, vol. 74, No. 7.

Aull et al., Geiger-Mode Avalanche Photodiodes for Three-Dimensional Imaging, Lincoln Laboratory Journal, 2002, pp. 335-350, vol. 13, No. 2.

* cited by examiner

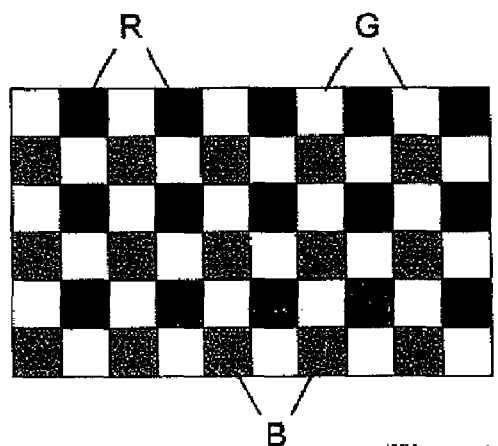
Fig. 1
Prior Art
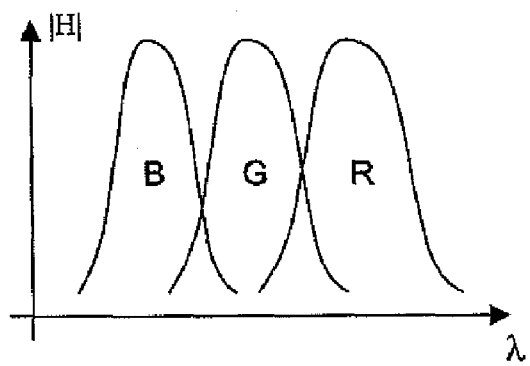
Fig. 2
Prior Art
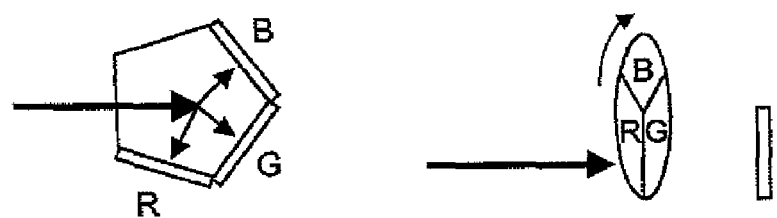
Fig. 3a
Prior Art
Fig. 3b
Prior Art

CONTROLLING SPECTRAL RESPONSE OF PHOTODETECTOR FOR AN IMAGE SENSOR

FIELD OF INVENTION

The present invention relates to image sensors, in particular to color image sensor for 2D or 3D image acquisition. In particular the present invention relates to a method for controlling the spectral response of light sensitive semiconductor elements in an array according to the independent claim 1 and to an image sensor with the characteristics according to the independent claim 15.

STATE OF THE ART

Conventional imagers can detect colored scenes by reconstructing a mosaic of pixels mostly sensitive to one of the primary colors (red "R", green "G", and blue "B"). Pixels are made selectively sensitive by covering them with a color filter. The filtering pattern is usually repeated over a matrix of 2×2 pixels favoring green. FIG. 1 shows one such color pattern as it is implemented in conventional solid-state imagers.

The separation of colors is dependent on the selectivity of the three filters. The spectral response |H| measured in typical filters found in commercial imagers is illustrated in FIG. 2.

This approach is relatively simple and R G B filters are available as a standard feature in all major CMOS and CCD technologies today. The color separation obtained in this fashion is imperfect due to the finite overlap of the various filters. Another disadvantage is the fact that interpolation is always needed and that the useful size of a pixel is quadrupled, thus causing an effective reduction of lateral resolution.

To resolve these issues one can utilize three independent imagers optically coupled to the lens via a prism or a set of mirrors and filters to perform color separation. FIG. 3a shows the apparatus with its three sensors bonded to the optical prism. This method is effective but expensive and potentially prone to long-term misalignment and ultimately image degradation.

A variation of this method, shown on FIG. 3b, is based on a mechanically activated filter that performs color separation sequentially in time on the same sensor. An advantage of this apparatus is the lower systematic mismatch between the three-color components since the same sensor captures them. The main disadvantage is however the need for moving parts that need be synchronized with the sensor's shutter, thus limiting the speed of the apparatus and, ultimately, its frame rate.

An alternative to these methods, requiring no moving parts, is the use of overlapping detectors, each one sensitive to a different color. Such method implies the use of at least three p-n junctions 1 (B-sensitive), 2 (G-sensitive), 3 (R-sensitive) at different depths. Due to the dependency of penetration depth from wavelength, it is possible to separate the three-color components by use of simple mathematical manipulations on the responses associated with the three p-n junctions 1, 2, 3. FIG. 4 shows the principle.

The main disadvantage of this method is a relatively shallow spectral response with a dull discrimination between the colors. FIG. 5 shows an example of the spectral response of the imager.

This behavior may require more important image processing algorithms. It may also cause a worsening of the signal to noise ratio in the image. Indeed the noise may be significantly amplified by the procedure thus contributing to the degradation of the picture.

SUMMARY OF THE INVENTION

It is an aim of the invention to provide a new image sensor, and a new method for controlling the spectral response of light sensitive elements in a sensor, that alleviates those problems of the prior art.

According to the invention, this problem is solved, among other, with a method for controlling the spectral response of light sensitive semiconductor elements in an array using an electric control signal applied to said semiconductor elements.

According to the invention, this problem is as well solved by an image sensor comprising:
  at least one light sensitive semiconductor elements, and
  a circuit for applying a control voltage to said semiconductor element so as to change its spectral response.

Advantageous the light sensitive semiconductor element is a single photon avalanche diode operating in Geiger mode and said control signal being applied as a reverse bias voltage of said avalanche diode. The light sensitive semiconductor element comprises a multiplication region, and the thickness of said multiplication region is controlled with said control signal.

An advantage is that the spectral response of the light sensitive element in the sensor can be changed—spatially or over time, without filtering material, moving parts or multiple overlapping junctions.

Another advantage is that the change of spectral response can be made very quickly, at any time, and even controlled by software or by a firmware if needed.

Advantageous embodiments of the present invention are given in the dependent claims.

SHORT DESCRIPTION OF THE DRAWINGS

The invention will be better understood with the help of the description of a specific embodiment illustrated by the figures in which:

FIG. 1 shows a conventional colour detection in solid state imagers as disclosed in the prior art;

FIG. 2 shows a spectral response of R G B filters in commercial imagers (prior art);

FIG. 3a shows three imagers coupled by a prism (prior art);

FIG. 3b shows a single sensor with rotating filer (prior art);

Figure 7A:
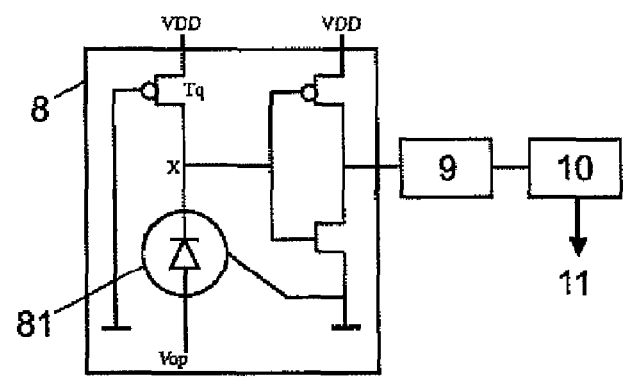
Figure 8:
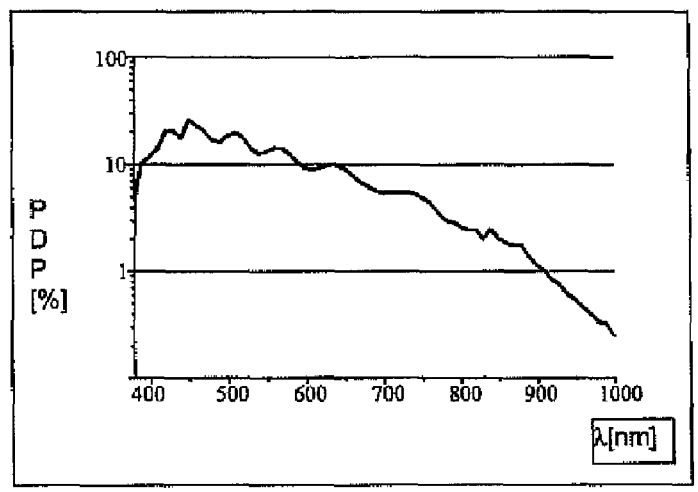
Figure 7B:
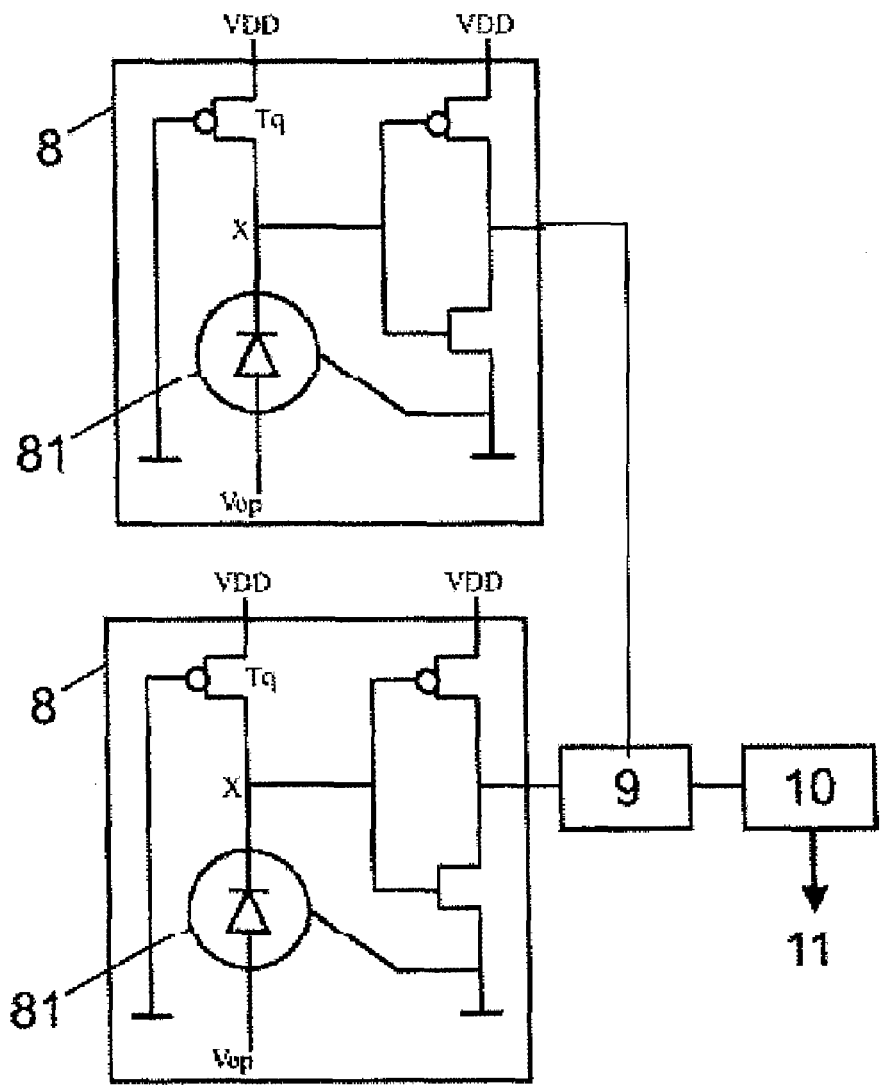
Figure 9:
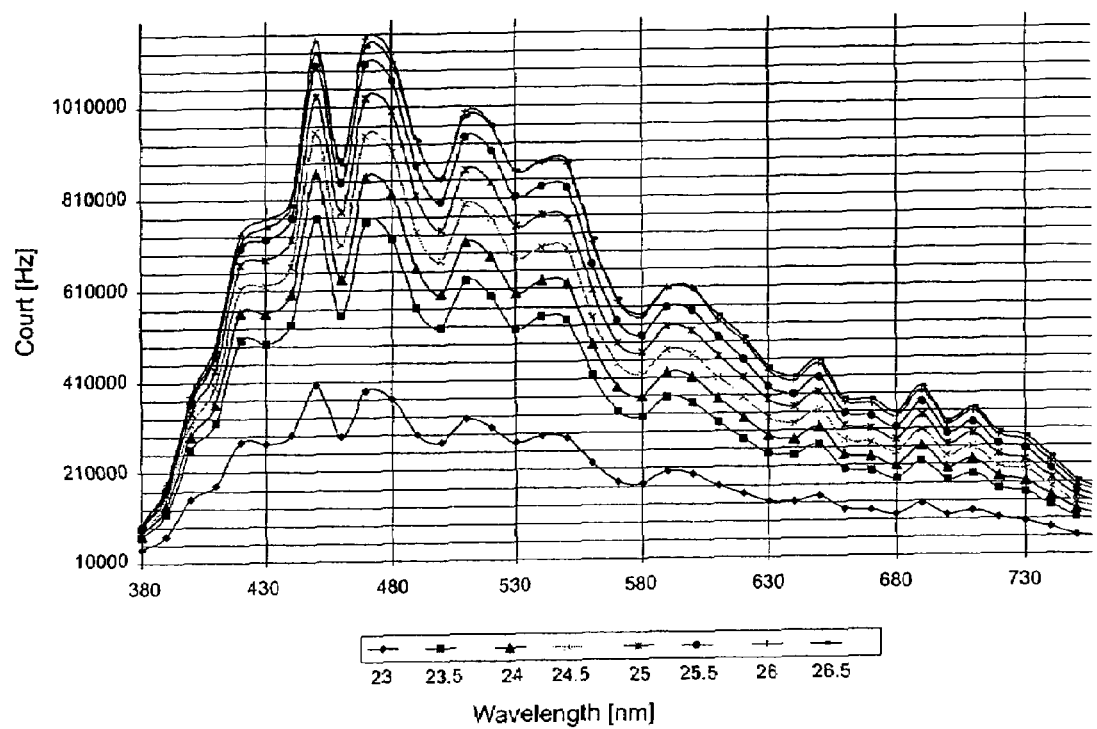
Figure 10:
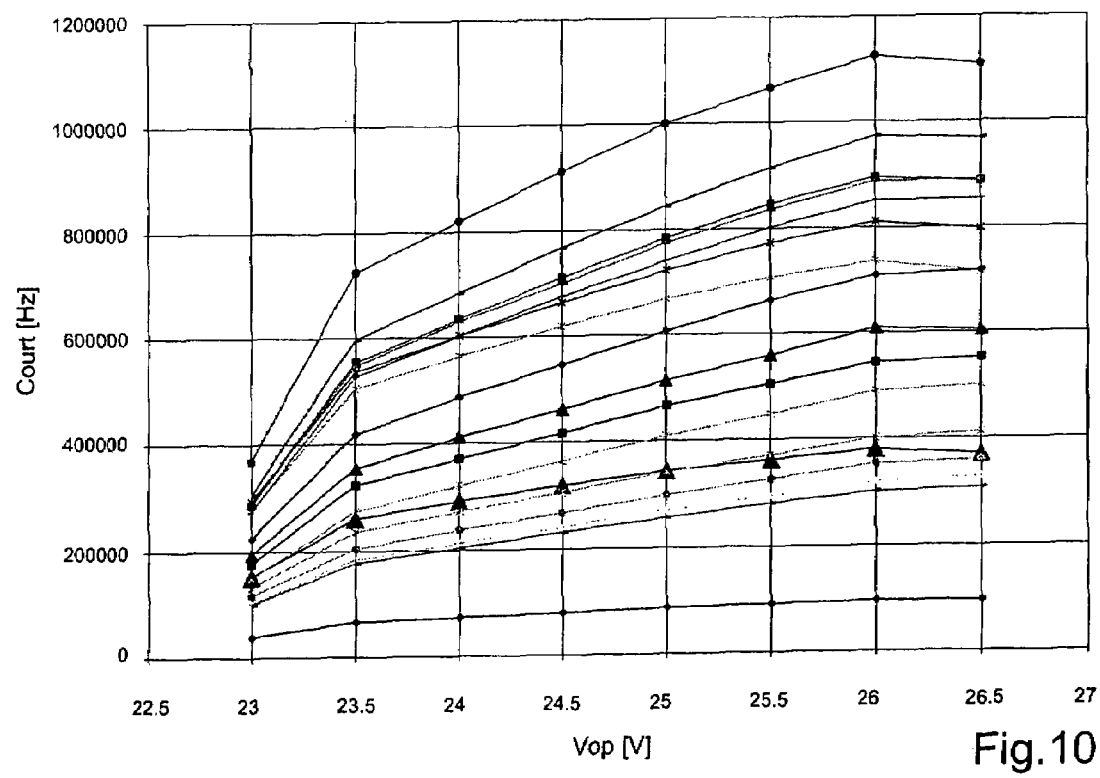
Figure 11:
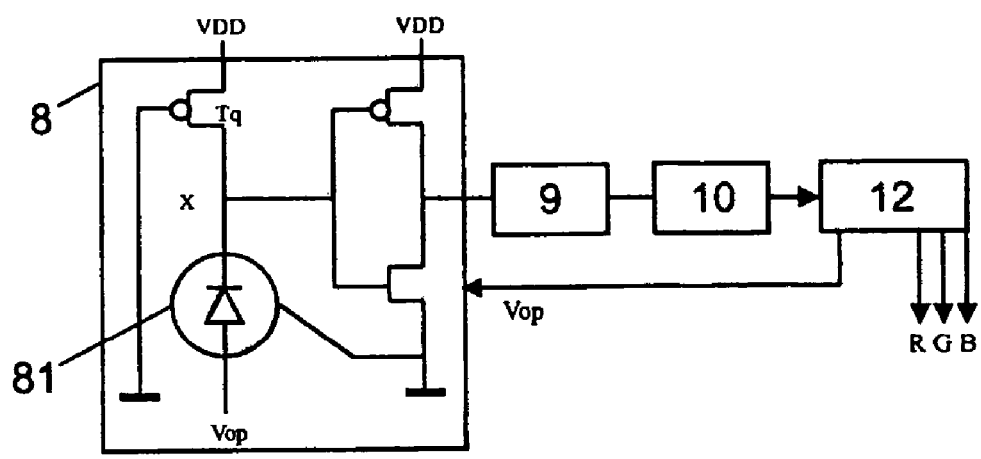

FIGS. 7(a) and 7(b) show the conversion of light intensity into digital counts;

FIG. 8 shows a photon detection probability in a typical SPAD;

FIG. 9 shows a diagram photon counts vs. wavelength at different values of $V_{op}$;

FIG. 10 shows a diagram sensor response vs. $V_{op}$ for a number of wavelength and FIG. 11 shows a colour detection setup.

Figure 12:
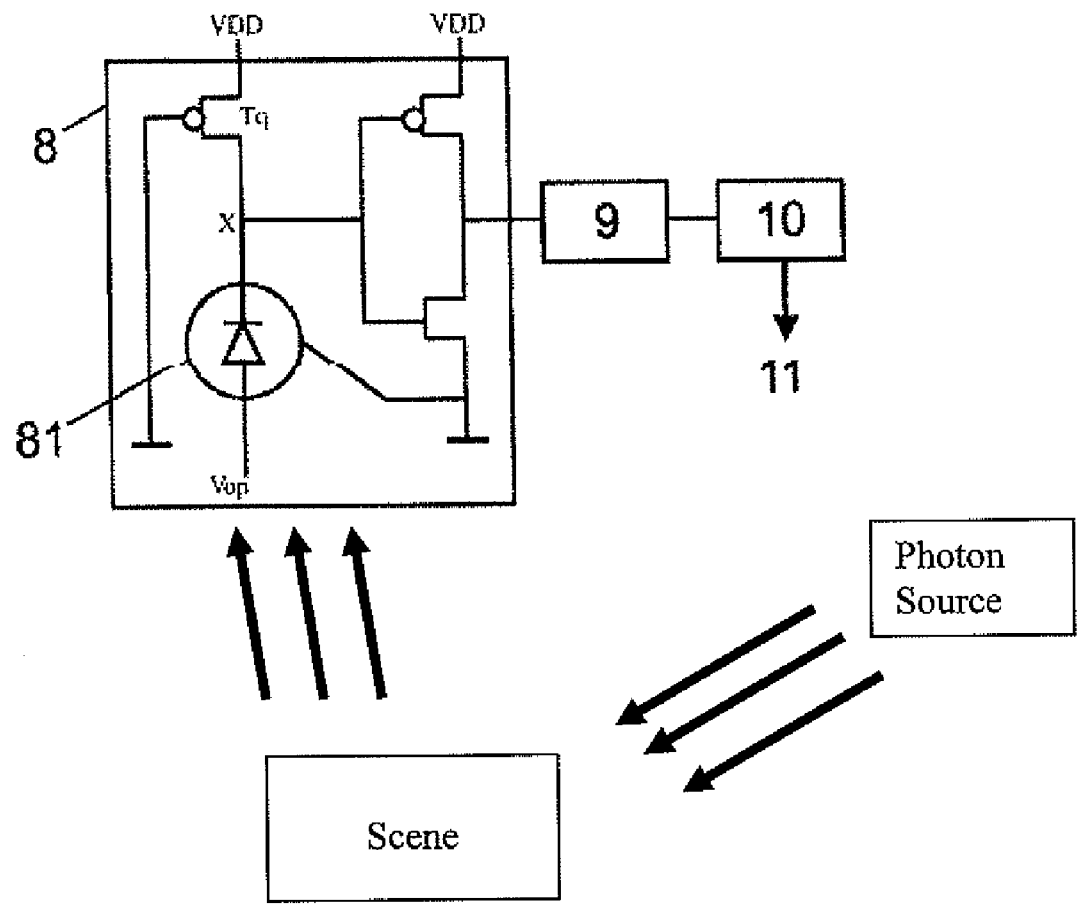

FIG. 12 shows a photon source reflected by an object in a scene and received by a semiconductor element.

DESCRIPTION OF AN EMBODIMENT OF THE INVENTION

In a preferred embodiment, the spectral response is changed by modulating the depth of the sensitive area of the light sensitive elements, using an appropriate control signal. Depth modulation enables capturing photons of different wavelengths at various rates.

Figure 4:
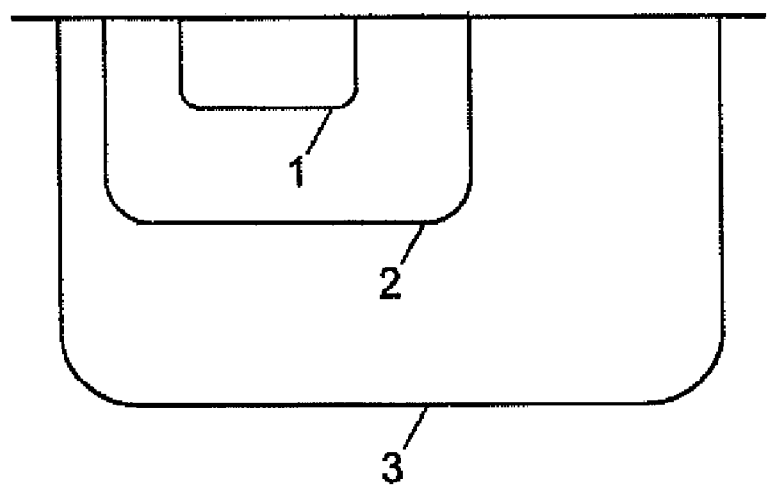
FIG. 4 shows an overlapping detector principle (prior art)
Figure 5:
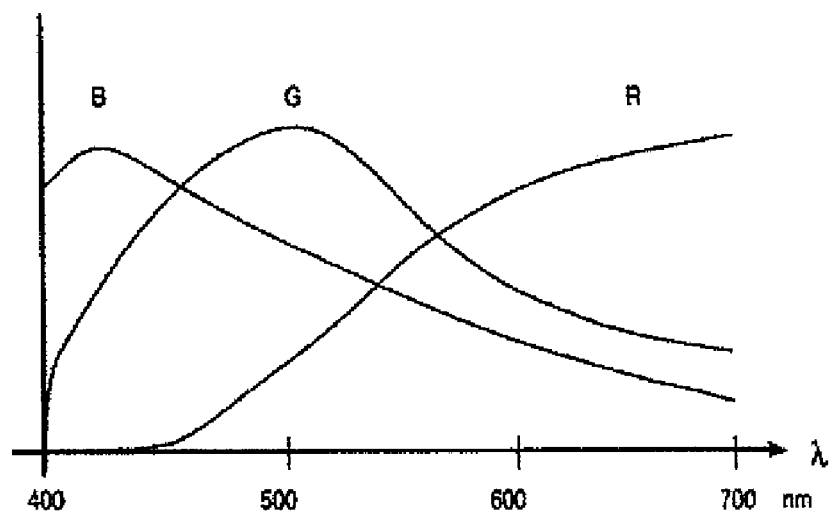
FIG. 5 shows a spectral response of an overlapping detector (prior art)
Figure 6:
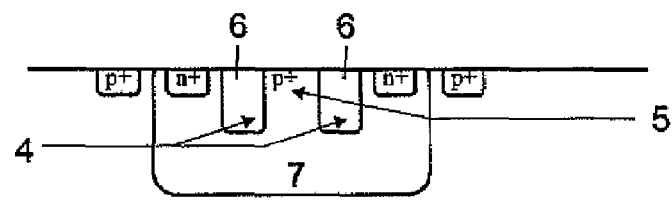
FIG. 6 shows a SPAD cross section.

In a preferred embodiment, the light sensitive elements are based on the Single Photon Avalanche Diode (SPAD) technology. SPADs are optical detectors sensitive to the arrival of a single photon. They are also known as photon counting devices. A SPAD operating in Geiger mode is a diode 81, or p-n junction, that is reverse biased beyond its breakdown voltage. Under those conditions the diode 81 p-n junction may trigger an avalanche upon photon arrival. Such zone is called multiplication region 5. FIG. 6 shows a cross-section example of a SPAD implemented in CMOS technology. Other structures are also possible in the framework of the invention and have been successfully demonstrated. The multiplication region 5, a guard ring 4 which consists of a p-well 6 and a deep n-well 7 are also shown in the picture.

The multiplication region 5 develops at and around a p-n junction at a depth below the silicon surface determined by design and technological parameters. In SPADs, the multiplication region 5 is usually 2 to 5 µm below the surface. Thus, photons with short wavelength are generally more likely to be detected. FIG. 8 shows an illustration of the spectral behavior of the Photon Detection Probability (PDP) in a typical SPAD.

If a SPAD array, including a number of SPAL) in rows and columns, is to be implemented, an appropriate read-out circuitry 9 may be built around a single device. When a photon is absorbed, the SPAD generates a digital pulse. In order to evaluate the intensity of light in a given time interval (integration time), it is sufficient to count the photons arrived during that time interval. Let us call photon count or simply count the result of such operation. FIG. 7 shows an example of the circuitry, although other types of counting and read-out configurations may be implemented. Connected to the pixel array 8, there is the read-out circuit 9, which read the array 8 and delivers the result to the counter 10. The reference number 11 refers to the digital counts.

It has been found within the framework of the invention that the PDP is strongly dependent on the reverse bias voltage $V_{op}$. This dependency is however not uniform throughout the spectral range. The PDP peaks tend to shift in wavelength with the increase of the bias voltage. This behavior is explained by the fact that the thickness of the multiplication region 5 is also modulated by the bias voltage $V_{op}$.

FIG. 9 shows the dependency of the spectral response from reverse bias voltage $V_{op}$.

One can show that the response to different colors can be effectively modulated by the reverse bias voltage $V_{op}$. The plot of FIG. 10 relates photon counts vs. $V_{op}$ for a number of wavelengths.

From the plot it can be seen that every wavelength has a unique behavior as $V_{op}$ increases. Let $c=f(\lambda,V_{op})$ be a deterministic function that relates wavelength and $V_{op}$ to the count c. At a given wavelength $\lambda_o$, $f(\lambda_o,V_{op})$ may be approximated, for example, by a polynomial of order n. Let c be the m-dimensional vector of all polynomial coefficients, where m is the dimension of the measurement space. Let $V_{op}=[1 \ V_{op} \ V_{op}^2 \ \ldots \ V_{op}^n]^T$, then, equation $c=AV_{op}$ may be used to compactly represent all polynomial coefficient, where A is a m×n matrix of real numbers. Suppose now that n=1, i.e. every count is linear with respect to $V_{op}$, then by calculating $\partial f(\lambda,V_{op})/\partial V_{op}$ it is possible to extract A. Assuming that each wavelength is associated with a different derivative (uniquity condition) and that at a given pixel the wavelength of the photons being counted does not change during integration, it is possible to exactly predict the wavelength of the photons reaching that pixel. Assuming that $\partial f(\lambda,V_{op})/\partial V_{op}$, can be computed exactly with two values of $V_{op}$, only two photon counts are necessary per pixel to make an exact wavelength determination.

Due to the non-linearity of $f(\lambda,V_{op})$ and the non-monotonicity of $\partial f(\lambda,V_{op})/\partial V_{op}$ however, it is preferable to record more photon counts. By $n^{th}$ order fitting it is possible to construct a simple look-up table for the extraction of RGB components from a measurement at a given reverse bias voltage. FIG. 11 shows a possible setup for color detection in a SPAD based sensor. The setup includes a SPAD or SPAD array 8, read-out circuitry 9, counters 10 and a simple processor for the color separation procedure (color separation 12). The processor also controls the voltage $V_{op}$ that needs to be varied over the time during the integration.

Due to the well-defined dependency of the size and shape of the multiplication region 5 from the reverse bias voltage $V_{op}$, color separation is inherently more efficient and precise. For the same reasons the device is more resilient to aging effects. Since color filtering is controlled electrically, time-division as well as space-division color filtering can be implemented on the fly by proper programming of the device. Finally, due to the lack of a physical filter on the surface of the detector, reflection and transmission losses can be kept to a minimum.

A sensor according to the invention will typically comprise an array of light sensitive semiconductor elements, for example SPADs, 1 decoder for row selection, one multiplexer for column selection, and a power supply for applying different reverse bias voltage levels to the elements, whereas the voltage levels applied may change spatially and/or over time. The color determination may be based on the number of photon counts during a single period, or preferably on the difference in number when the reverse bias voltage is changed.

The invention refers as well to an image sensor comprising at least one light sensitive semiconductor elements and a circuit for applying a control voltage ($V_{op}$) to said semiconductor element so as to change its spectral response. It can comprise means for electrically adjusting the sensor's overall response to light regardless of the spectral distribution and means for electrically adjusting the spectral response of all semiconductor elements so as to adjust the balance of white. Said sensor can be a complementary metal-oxide-semiconductor element, or any other suitable SPAD structure.

Without being limiting, the sensor of the invention could be part of a digital camera, video camera, 3D image sensors, scanner, video telephone, autofocus system, medical image acquisition system, etc. The sensor may also be connected to a sensor driving circuit and/or to a general purpose processing unit for controlling the reverse bias voltage applied to the different light sensitive elements and for processing the digital signal output by those elements.

As shown in FIG. 12, the time of flight of a photon as it leaves a photon source and is reflected by an object in the scene and received by said semiconductor element, could be computed and the position of said object based on said time of flight could be determined. The present invention refers as well to a bi-dimensional image capture sensor using an inventive sensor.

The waveform of the reverse bias control voltage ($V_{op}$) applied to each light sensitive element may thus be varied over time so as to adapt the spectral response of the light sensitive element, to determine the difference in the number of photons counted when said voltage varies, or as an electronic shutter for stopping the count of photons outside from the measurement windows.

REFERENCE NUMBERS

1 B-sensitive junction
2 G-sensitive junction
3 R-sensitive junction
4 Guard ring
5 Photo-multiplication region
6 p-well
7 n-well
8 Pixel Array
81 Diode
9 Read-out circuitry
10 Counter
11 Digital counts
12 Color separation
c photon count
B Blue
G Green
PDP Photon Detection Probability
R Red
$V_{op}$ control voltage

The invention claimed is:

1. A method for modulating the spectral response of light sensitive semiconductor elements in an array using a modulated voltage as an electric control signal applied to said light sensitive semiconductor elements, said light sensitive semiconductor elements being diodes operating in Geiger mode, the method comprising:
   applying a first voltage to at least one light sensitive semiconductor element, and detecting photons with a first spectral response corresponding to said first voltage;
   at a different time and/or spatial location, applying a second voltage to at least one light sensitive semiconductor element, said second voltage being different from said first voltage, and detecting photons with a second spectral response corresponding to said second voltage.

2. The method of claim 1, said light sensitive semiconductor elements including a single photon avalanche diode operating in Geiger mode.

3. The method of claim 2, said control signal being applied is a reverse bias voltage of said avalanche diode.

4. The method of claim 1, said light sensitive semiconductor elements comprising a multiplication region, said method comprising a step of controlling the thickness of said multiplication region with said control signal.

5. The method of claim 1, comprising a step of changing the spectral response of at least one said light sensitive semiconductor elements in said array by modulating said electric control signal over time.

6. The method of claim 1, further comprising:
   computing the time of flight of a photon as it leaves a photon source and is reflected by an object in a scene and received by said semiconductor elements,
   determining the position of said object based on said time of flight.

7. A method comprising controlling the spectral response of light sensitive semiconductor elements in an array using an electric control signal applied to said semiconductor elements, changing the spectral response of at least one said light sensitive semiconductor elements in said array by modulating said electric control signal over time, varying a reverse bias voltage applied to one light sensitive semiconductor element, determining the variation in the number of photons detected induced by this variation, and determining a color based on said variation.

8. A method comprising modulating the spectral response of light sensitive semiconductor elements in an array using an electric control signal applied to said light sensitive semiconductor elements, said light sensitive semiconductor elements being a diode operating in Geiger mode, and said electric control signal being a modulated voltage to adapt the spectral response of the light sensitive semiconductor elements, wherein different electric control signal are applied simultaneously or during a single frame to different light sensitive semiconductor elements in said array, so as to change the spectral response between said different semiconductor elements.

9. The method of claim 8, wherein the spectral response of one or more pixels in said array is selectively changed simultaneously.

10. A method comprising controlling the spectral response of light sensitive semiconductor elements in an away using an electric control signal applied to said semiconductor elements, said light sensitive semiconductor element being a single photon avalanche diode, said control signal being applied as a reverse bias voltage of said single photon avalanche diode, counting the number of photons received by at least one of said semiconductor elements during a period, and determining a color indication from said number of photons and from said reverse bias voltage applied to said at least one of said semiconductor elements.

11. The method of claim 10, wherein said color indication is based on the change in said number of photons when said reverse bias voltage is changed.

12. An image sensor comprising:
   at least one light sensitive semiconductor element, said at least one light sensitive semiconductor element being a diode operating in Geiger mode; and,
   a circuit for applying a first voltage to said at least one light sensitive semiconductor element and detecting photons with a first spectral response corresponding to said first voltage, and further for applying at a different time and/or spatial location, a second voltage to the at least one light sensitive semiconductor element and detecting photons with a second spectral response corresponding to said second voltage.

13. The sensor of claim 12, comprising an away of said at least one light sensitive semiconductor element.

14. The sensor of claim 12, wherein said control voltage can be varied over time.

15. The sensor of claim 12, wherein said at least one light sensitive semiconductor element comprises a single photon avalanche diode operating in Geiger mode, and wherein said control voltage is the reverse bias voltage of said avalanche diode.

16. The sensor of claim 12, comprising means for electrically adjusting the sensor's overall response to light regardless of a spectral distribution of the light.

17. The sensor of claim 13, comprising means for electrically adjusting the spectral response of all semiconductor elements so as to adjust a balance of white.

18. The sensor of claim 12, said sensor being a complementary metal-oxide-semiconductor element.

19. A bi dimensional image capture sensor including a sensor according to claim 12.

20. An image sensor comprising:
   an array of light sensitive semiconductor elements, each light sensitive semiconductor element in said away of light sensitive semiconductor element being a diode operating in Geiger mode; and, a circuit for applying a control voltage to said at least one light sensitive semiconductor element so as to modulate its spectral response, wherein different control voltage can be applied simultaneously or during a same frame to different semiconductor elements in said array.

21. An image sensor comprising:

an array of at least one light sensitive semiconductor element;

a circuit for applying a control voltage to said at least one semiconductor element so as to change its spectral response;

a counter for counting the number of photons received by each element in the array during predefined periods; and, a color determination module for determining a color based on the output of said counter and on the control voltage applied to said element.

22. A method comprising changing the spectral response of light sensitive semiconductor elements in an array using an electric control signal applied to said light sensitive semiconductor elements, said light sensitive semiconductor elements being a diode operating in Geiger mode, and said electric control signal being a voltage that is changed over time and/or depending on their spatial position in the array, so as to detect light with a first spectral response at a first time and/or at a first spatial location in the array, and to detect light with a second different spectral response at a second time and/or at a second spatial location in the array.

23. An image sensor comprising:

at least one light sensitive semiconductor element, said at least one light sensitive semiconductor element being a diode array operating in Geiger mode; and, a circuit for applying a control voltage to said at least one light sensitive semiconductor element so as to modulate its spectral response, the control voltage changing to change the spectral response over time and/or depending on their spatial position in the array, so as to detect light with a first spectral response at a first time and/or at a first spatial location in the array, and to detect light with a second, different spectral response at a second time and/or at a second spatial location in the array.

24. An image sensor comprising:

at least one light sensitive semiconductor element, said at least one light sensitive semiconductor element being a diode array operating in Geiger mode; and, a circuit for applying a reverse bias voltage modulated over time and/or depending on their spatial position in the array to said at least one light sensitive semiconductor element so as to modulate its spectral response, so as to detect light with a first spectral response at a first time and/or at a first spatial location in the array, and to detect light with a second, different spectral response at a second time and/or at a second spatial location in the array.

* * * * *